United States Patent
Ogusu et al.

[19]

[11] Patent Number: 6,040,934
[45] Date of Patent: Mar. 21, 2000

[54] RECEPTACLE-TYPE OPTICAL TRANSMISSION/RECEPTION APPARATUS

[75] Inventors: Masahiro Ogusu; Tazuko Tomioka, both of Tokyo; Shigeru Ohshima, Yokohama, all of Japan

[73] Assignee: Kabushiki Kaisha Toshiba, Kawasaki, Japan

[21] Appl. No.: 08/878,553

[22] Filed: Jun. 19, 1997

[30] Foreign Application Priority Data

Jun. 21, 1996 [JP] Japan ................................. 8-161780

[51] Int. Cl.⁷ ................................................. H04B 10/00
[52] U.S. Cl. .............................. 359/152; 372/6; 385/92; 385/34
[58] Field of Search .................. 359/152, 154, 359/159, 163, 110; 385/15, 31, 33, 34, 52, 88, 92–94; 372/6

[56] References Cited

U.S. PATENT DOCUMENTS

| | | | |
|---|---|---|---|
| 4,262,362 | 4/1981 | Kiernan et al. | 359/114 |
| 4,767,171 | 8/1988 | Keil et al. | 359/114 X |
| 5,127,075 | 6/1992 | Althous et al. | 385/94 |
| 5,315,609 | 5/1994 | Tanaka et al. | 385/92 X |
| 5,528,407 | 6/1996 | Nakata et al. | 359/152 |
| 5,552,918 | 9/1996 | Krug et al. | 359/152 |

FOREIGN PATENT DOCUMENTS 223412  8/1992  Japan .
198999  8/1995  Japan .

OTHER PUBLICATIONS

The Transactions of the Institute of Electronics, Information and Communication Engineers, Makoto Shimaoka, et al, "Design of Receptacle Laser Diode Modules with Low Reflection" vol. J77–C–I, No. 11 1994, pp. 695–701.

*Primary Examiner*—Thomas Mullen
*Attorney, Agent, or Firm*—Oblon, Spivak, McClelland, Maier & Neustadt, P.C.

[57] ABSTRACT

A receptacle-type optical module has a semiconductor laser device, and a glass rod arranged to be contacted tightly with an optical fiber ferrule to guide light emitted from the semiconductor laser device to an optical fiber. A marker is formed on the physical contact face of the glass rod to position the optical axis of the semiconductor laser device. The semiconductor laser device is caused to emit light, and at the same time, the marker image on the physical contact face and the image of the light emitted from the semiconductor laser device are picked up with an infrared camera and subjected to two-dimensional image processing by an image processing unit, thereby detecting the positional shift of the semiconductor laser device from the desired position. A fine adjustment stage is driven in the direction perpendicular to the optical axis of the semiconductor laser device on the basis of the information of the positional shift to position the semiconductor laser device.

10 Claims, 7 Drawing Sheets

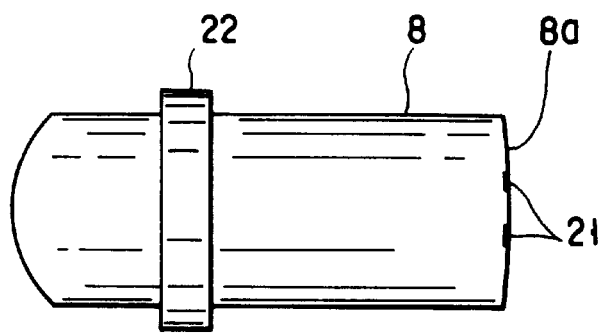 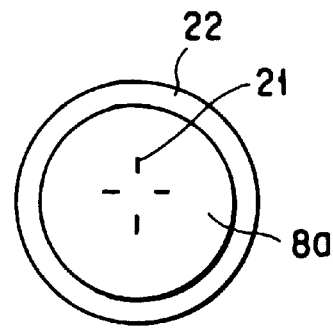
FIG. 3A  FIG. 3B
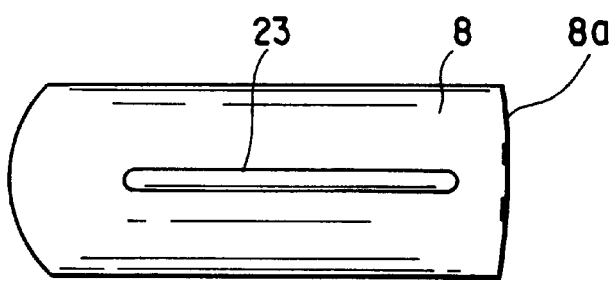 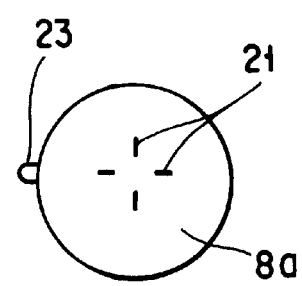
FIG. 4A  FIG. 4B
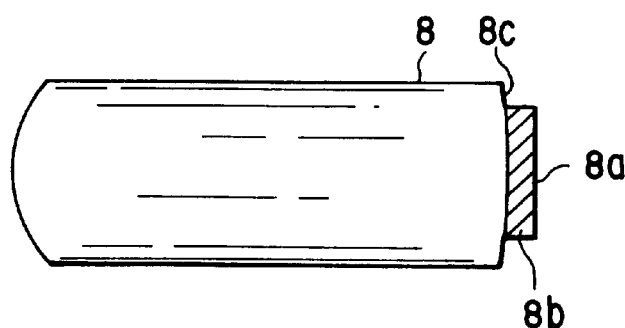 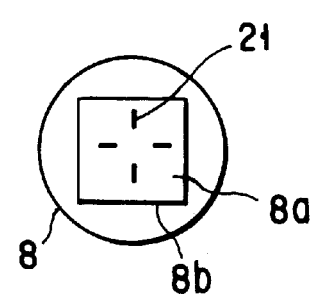
FIG. 5A  FIG. 5B

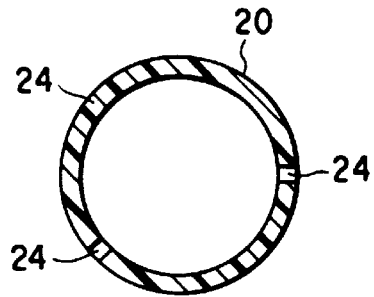
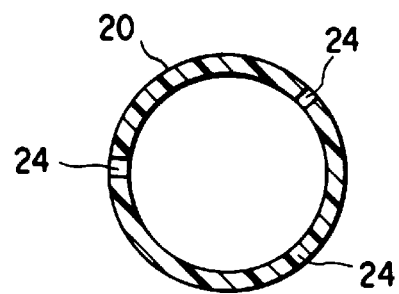
FIG. 6A   FIG. 6C
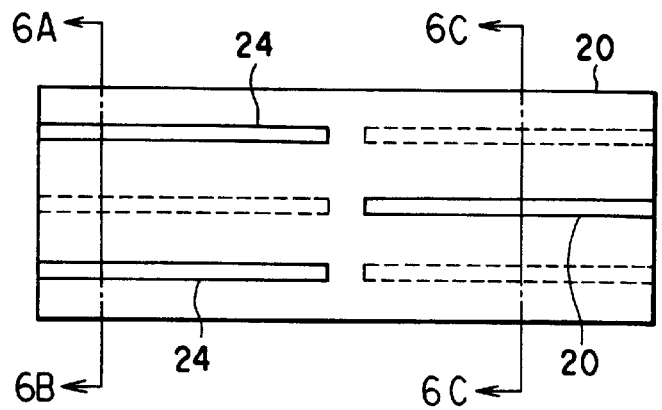
FIG. 6B
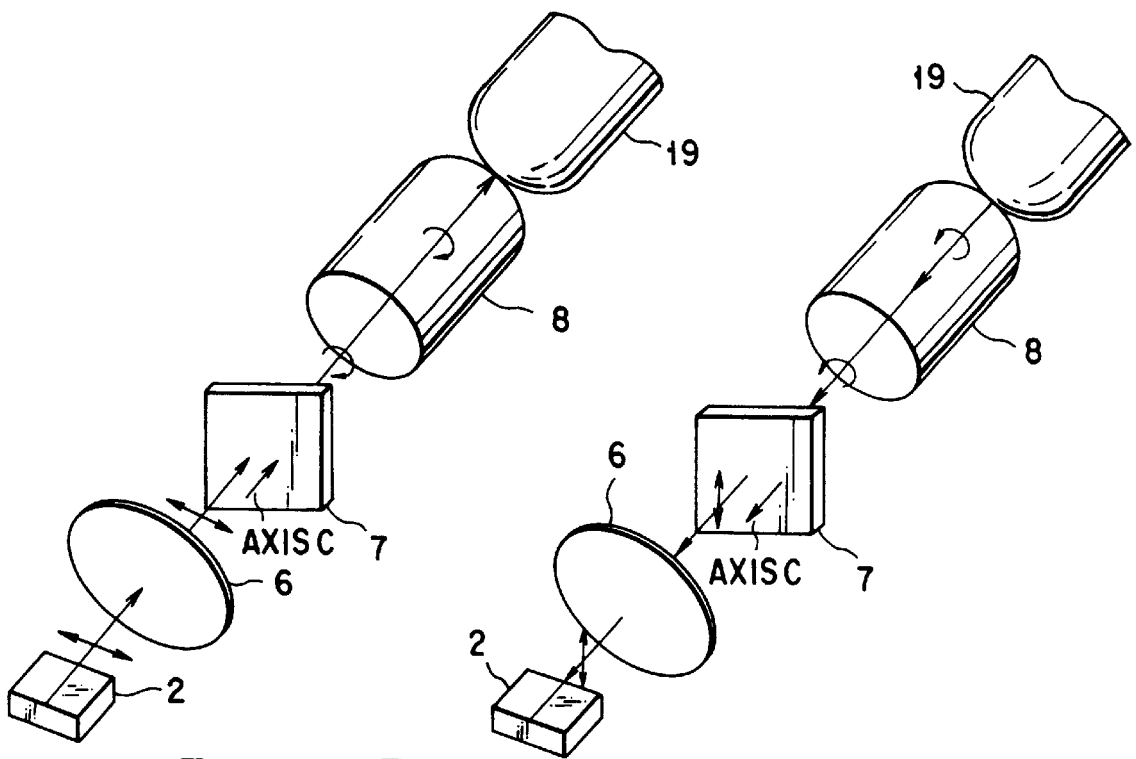
FIG. 7A   FIG. 7B

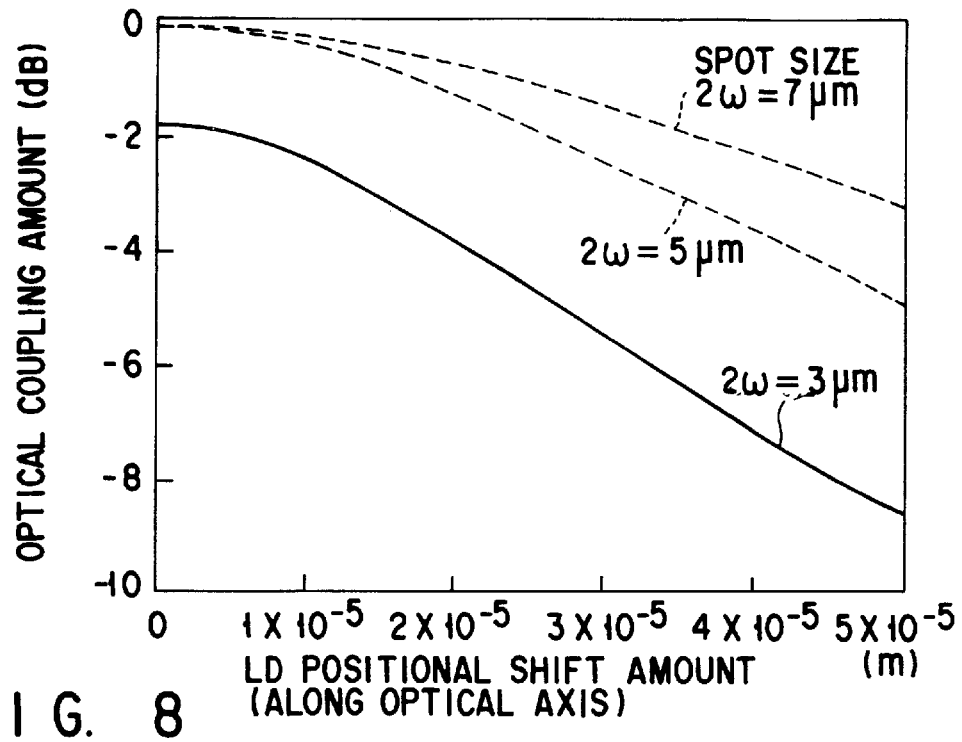
F I G. 8
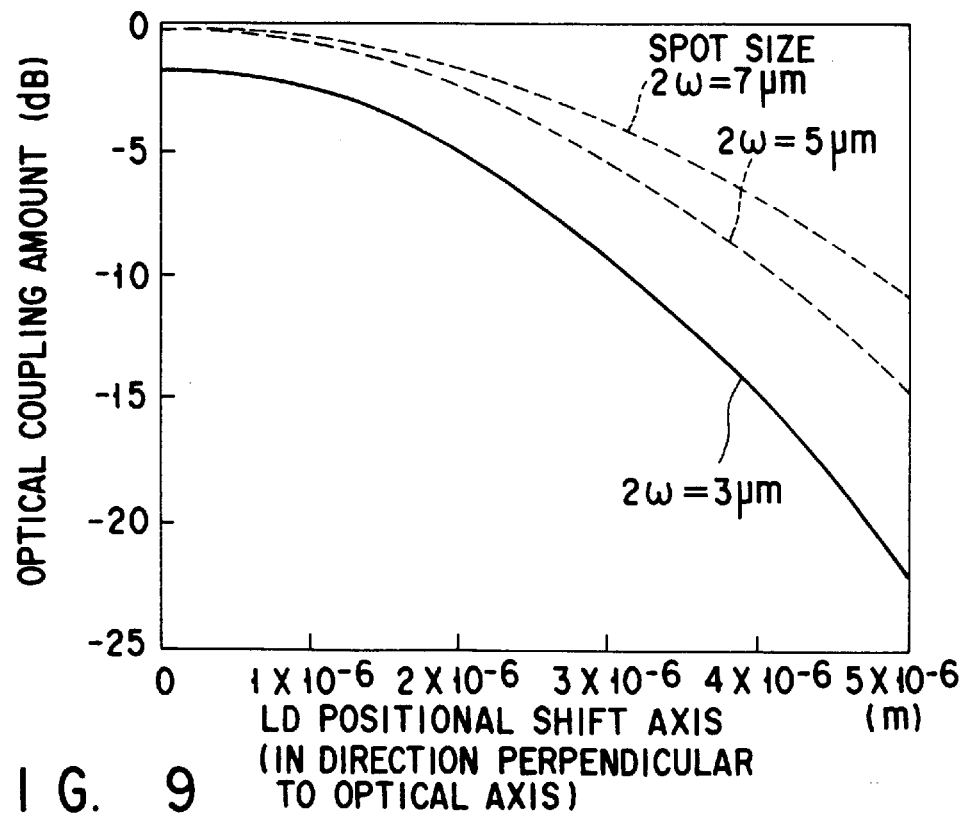
F I G. 9

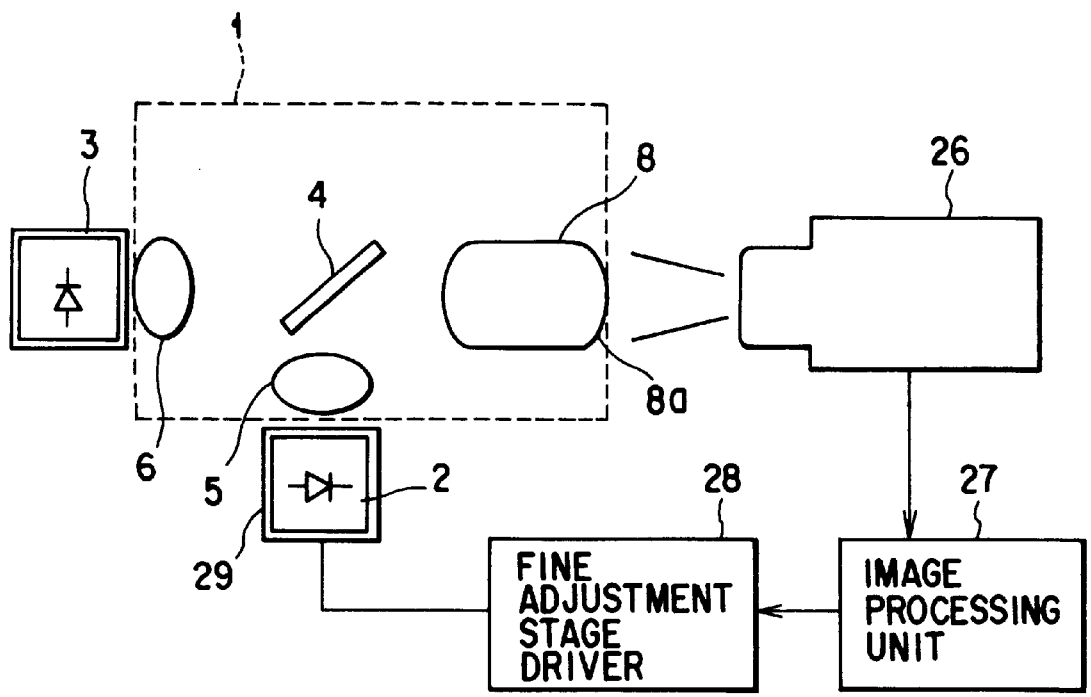
F I G. 10
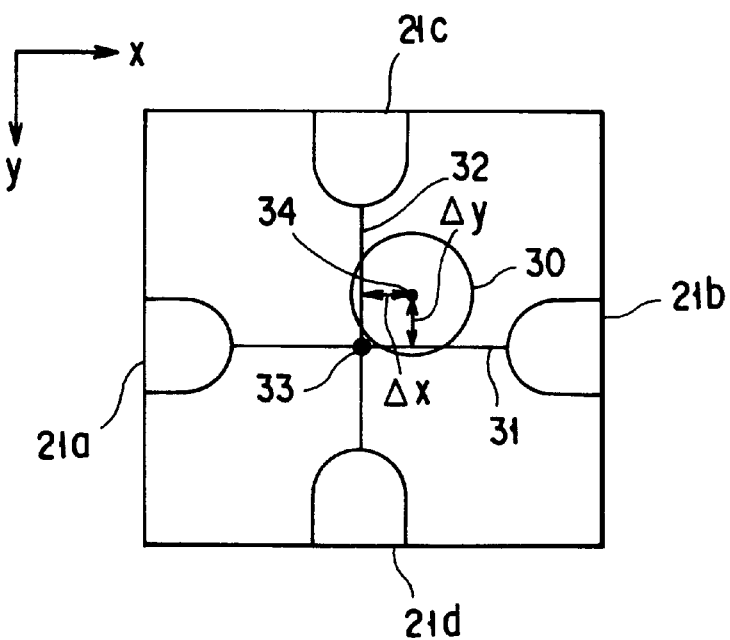
F I G. 11

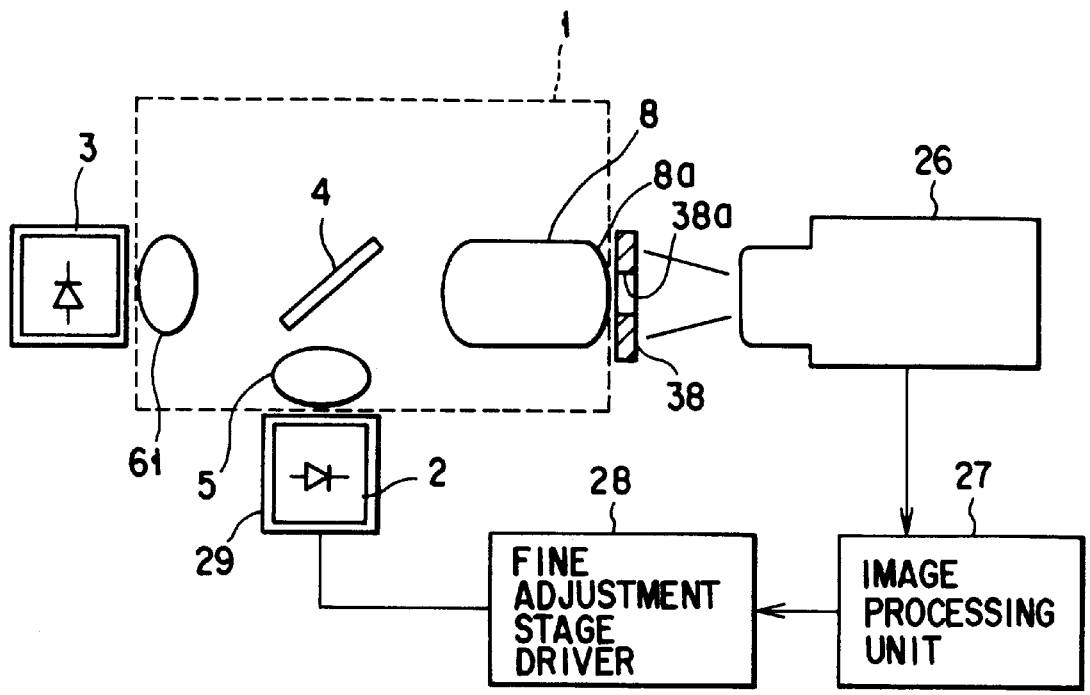
F I G. 14
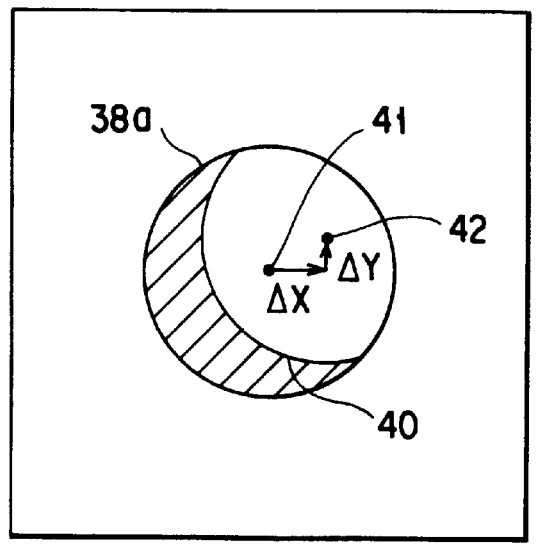
F I G. 15

RECEPTACLE-TYPE OPTICAL TRANSMISSION/RECEPTION APPARATUS

BACKGROUND OF THE INVENTION

The present invention relates to a receptacle-type optical transmission/reception apparatus used for optical communication and, more particularly, to a reliable apparatus which can be manufactured at a low cost and a method of manufacturing the same.

An optical transmission/reception apparatus (to be referred to as an optical module hereinafter) for transmitting/receiving an optical signal is one of the basic devices that support the optical communication technology. To popularize information service systems including optical fiber cable wiring to end subscribers, each subscriber must be equipped with an inexpensive optical module.

The arrangements and structures of components for optically coupling an optical fiber to a semiconductor laser or photodetector in an optical module require a fixing accuracy on the order of $\mu$m. Accordingly, not only cost reduction but also an increase in accuracy and reliability is required for the optical module.

A receptacle-type optical module in which an optical fiber connector is detachable is known as a form of optical modules. The receptacle-type optical module does not require mounting a pigtail fiber, unlike a device with a pigtail fiber, and is advantageous in cost reduction. For this reason, the receptacle-type optical module has received a great deal of attention in recent years and is commercially available. Such a receptacle-type optical module is described in, e.g., "IEICE Papers" 94, Vol. J77-C-1, No. 11, pp. 695–702, or Jpn. Pat. Appln. KOKAI Publication No. 7-198999.

The conventional receptacle-type optical module is a device dedicated to either transmission or reception.

For the conventional receptacle-type optical module, the ferrule of an optical fiber connector is mounted in the receptacle of the receptacle-type optical module, and thereafter, optical components including a semiconductor laser device are fixed in the optical module.

However, such positioning cannot help being difficult. Without knowing the direction and magnitude of a positional shift from the optical axis of the optical fiber, the semiconductor laser device must be positioned, i.e., the accurate position of the semiconductor laser device must be found out along the optical axis and in a direction perpendicular to the optical axis with trial and error. This operation takes, a long time and much labor until positions where the components are fixed are determined. This problem in manufacturing is one of factors preventing cost reduction.

In the optical modules disclosed in the prior art, a glass plate provided in the receptacle of the receptacle-type optical module is used in order to contact tightly with the ferrule of the optical fiber connector. This structure intends to prevent light emitted from the semiconductor laser device from being reflected by the optical fiber end face and returning to the laser device. Such reflected/returning light makes the operation of the semiconductor laser device unstable and, consequently, adversely affects the transmission characteristics, e.g., increases noise in emitted light.

However, even when a proper physical contact is obtained between the glass plate and the optical fiber ferrule, reflected light from the optical fiber end face still exists provided the refractive index of the glass plate and that of the optical fiber are not the same. And the reflected light returns to the semiconductor laser device. The above problem has not been solved yet.

BRIEF SUMMARY OF THE INVENTION

The present invention has been made to solve the above problems, and its first object is to provide a compact receptacle-type optical transmission/reception apparatus capable of performing both transmission and reception.

It is the second object of the present invention to provide a receptacle-type optical transmission/reception apparatus capable of shortening the working time required to position/fix a semiconductor laser device and reducing the cost.

It is the third object of the present invention to provide a receptacle-type optical transmission/reception apparatus capable of minimizing reflected/returning light to a semiconductor laser device to obtain satisfactory transmission characteristics.

In order to achieve the above objects, according to the first aspect of the present invention, there is provided a receptacle-type optical transmission/reception apparatus comprising a casing, a glass rod arranged in the casing and having a physical contact face to be contacted tightly with an optical fiber ferrule, a receptacle arranged in the casing to detachably hold the optical fiber ferrule in tight contact with the physical contact face of the glass rod, a semiconductor laser device arranged in the casing to emit light through the glass rod, a photo-detecting device arranged in the casing to detect light incident through the glass rod, and an optical branching device for guiding the light emitted from the semiconductor laser device to the glass rod and guiding the light incident through the glass rod to the photodetecting device.

According to the second aspect of the present invention, there is provided a receptacle-type optical transmission/reception apparatus comprising a casing, a glass rod arranged in the casing and having a physical contact face to be contacted tightly with an optical fiber ferrule, a semiconductor laser device arranged in the casing to emit light through the glass rod, and a marker formed on the physical contact face of the glass rod to position the semiconductor laser device.

A method of manufacturing this apparatus comprising the steps of causing the semiconductor laser device to emit light and picking up a spot image of the light from the semiconductor laser device on the physical contact face, detecting a positional shift of the semiconductor laser device from the desired position on the basis of a shift amount of the spot image from a central position of the physical contact face, the contact position being detected on the basis of the marker, and positioning the semiconductor laser device on the basis of information of the positional shift.

The central position of the physical contact face may be detected with reference to a pinhole of a pinhole plate inserted in the casing to be coaxial with the glass rod.

According to the third aspect of the present invention, a $\lambda/4$ polarizing plate is arranged in the casing on the optical path of the light emitted from the semiconductor laser device to reduce reflected/returning light to the semiconductor laser device and obtain satisfactory transmission characteristics.

At least the physical contact face of the glass rod is preferably formed of substantially the same material as that of a core of an optical fiber.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A and 3B are side and front views, respectively, showing a glass rod;

FIGS. 4A and 4B are side and front views, respectively, showing a glass rod of another example of the present invention;

FIGS. 5A and 5B are side and front views, respectively, showing a glass rod of still another example of the present invention;

FIGS. 6A to 6C are front, side, and rear views, respectively, showing the structure of a split sleeve proposed;

FIGS. 7A and 7B are perspective views for explaining the function of a quarter wave plate;

FIG. 8 is a graph showing the relationship between the positional shift amount of a semiconductor laser device along the optical axis and the amount of optical coupling to the optical fiber;

FIG. 9 is a graph showing the relationship between the positional shift amount of the semiconductor laser device in a direction perpendicular to the optical axis and the amount of optical coupling to the optical fiber;

FIG. 10 is a schematic view for explaining a method of positioning the semiconductor laser device;

FIG. 11 is a view showing an image obtained when the image of the physical contact face of the glass rod is picked up with an infrared camera;

FIG. 14 is a schematic view for explaining a method of positioning a semiconductor laser device in the second embodiment of the present invention; and FIG. 15 is a view showing an image obtained when the image of the physical contact face of the glass rod is picked up with an infrared camera.

DETAILED DESCRIPTION OF THE INVENTION

The embodiments of the present invention will be described below with reference to the accompanying drawing.

Figures 1, 2:
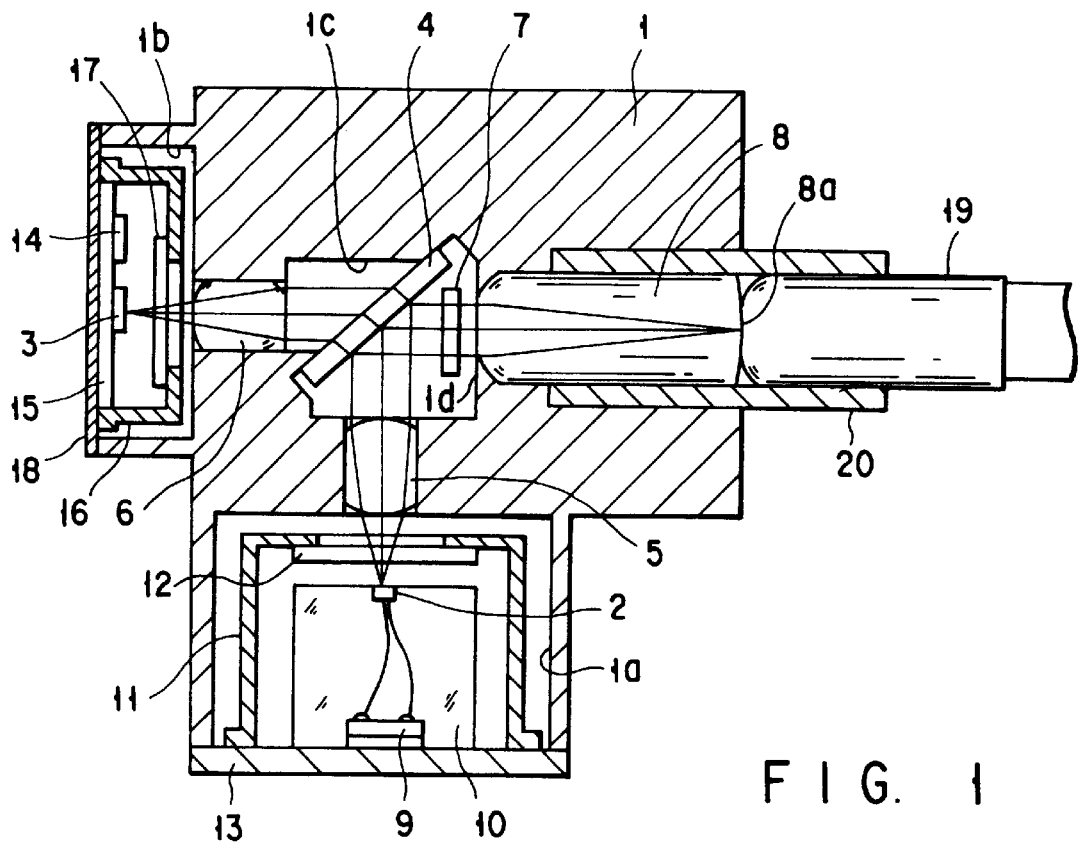
FIG. 1 is a longitudinal sectional view showing the structure of an optical module according to an embodiment of the present invention.
FIG. 2 is a view for explaining the positional relationship between the optical axis of a second coupling lens and that of incident light.

FIG. 1 is a sectional view showing the structure of a bidirectional receptacle-type optical transmission/reception apparatus (to be referred to as an optical module hereinafter) according to an embodiment of the present invention. This optical module is constituted by a device block 1 as a casing and optical components arranged in this device block 1, i.e., a semiconductor laser device 2, a photodetector 3, an optical branching device 4, a first coupling lens 5, a second coupling lens 6, and a glass rod 8. A quarter wave plate 7 is optically included.

Reference numeral 19 in FIG. 1 denotes a ferrule of an optical fiber connector connected to the optical module. One end portion of the optical fiber with its central axis matching that of the ferrule 19 is mounted in the ferrule 19.

The device block 1 is manufactured by relatively inexpensive molding such as a lost wax process or metal injection molding and has a laser accommodation portion 1a for accommodating the semiconductor laser device 2 and a detector accommodation portion 1b for accommodating the photodetector 3. The device block 1 also has a hollow portion 1c in which the optical branching device 4, the first coupling lens 5, the second coupling lens 6, the quarter wave plate 7, and the glass rod 8 are accommodated.

The semiconductor laser device 2 is mounted on a substrate 10 together with a driver IC 9 for driving the semiconductor laser device 2 in accordance with a transmission signal. The substrate 10 is accommodated on a can package base 13 and sealed with a package cap 11. And the sealed package is accommodated in the laser accommodation portion 1a of the device block 1 using YAG-welding. A transparent glass window 12 for passing emitted light is arranged in front of the semiconductor laser device 2. As the semiconductor laser device 2, a device for emitting light in the infrared range for optical communication is used.

The photodetector 3 is mounted on a substrate 15 together with a preamplifier IC 14 for amplifying a received signal. The substrate 15 is accommodated on a can package base 18 and sealed with a package cap 16. The sealed package is accommodated in the detector accommodation portion 1b of the device block 1 using YAG-welding. A transparent glass window 17 for passing incident light is arranged in front of the photodetector 3. As the photodetector 3, a photodiode is used.

The first coupling lens 5 guides light emitted from the semiconductor laser device 2 to the optical branching device 4. The second coupling lens 6 guides incident light which has passed through the optical branching device 4 to the photodetector 3.

As shown in FIG. 2, an axis 6a of the second coupling lens 6 is offset with respect to an optical axis L2 of incident light (glass rod 8) in a direction perpendicular to the optical axis by a predetermined amount. With this structure, when the incident light is focused on the light-receiving surface of the photodetector 3, light reflected by the photodetector 3 can be prevented from being coupled to the optical fiber because the incident angle of the reflected light to the optical fiber is too large. This function will be described later in detail.

For the first and second coupling lenses 5 and 6, aspherical lenses which consist of molded glass and can be mass-produced may be used to reduce the spherical aberration and cost. However, the aspherical lens is not necessarily more advantageous than a normal spherical lens for a position shift. Therefore, when the optical module is required to be inexpensive, a spherical lens advantageous in position shift characteristics is preferably used, although some coupling loss is generated by aberration. An example of the spherical lens which can be easily manufactured is a ball lens. When a ball lens is cut into a drum shape and mass-produced, the cost can be reduced, and a high spherical accuracy can be obtained.

To minimize light reflected by the optical components including the first coupling lenses 5 and 6 antireflection coatings are preferably deposited on these optical components. In case of a wavelength-multiplexed bidirectional transmission optical module, crosstalk characteristics between optical signals having different wavelengths must also be taken into consideration.

As shown in FIG. 1, the optical branching device 4 reflects light emitted from the semiconductor laser device 2 and guides the reflected light to the side of the glass rod 8. The optical branching device 4 also transmits light incident through the glass rod 8 and guides the incident light to the side of the photodetector 3. In this embodiment, a half mirror, or a dichroic mirror (optical filter), i.e., a component having wavelength selection properties is used.

When a half mirror is used as the optical branching device 4, ping-pong bidirectional transmission in which one of transmission and reception is selectively performed is enabled. When a dichroic mirror is used, wavelength-multiplexed simultaneous bidirectional transmission is enabled by using different wavelengths for transmission and reception.

When an optical filter is used as the optical branching device 4, and the optical filter is realized by a dielectric multilayered filter, an optical low-pass filter or an optical high-pass filter can be manufactured. However, the crosstalk characteristics may become insufficient depending on the incident angle of light on the multilayered filter. To improve the crosstalk characteristics, an optical low-pass filter or an optical high-pass filter may be inserted on the optical branching device 4 side of the coupling lens 5 or 6 to improve the wavelength discrimination characteristics.

The glass rod 8 is arranged on the optical path of emitted/incident light and has a physical contact face 8a with respect to the optical fiber ferrule 19. A split sleeve 20 partially projecting from the device block 1 is fitted on the glass rod 8. The split sleeve 20 is inserted into the projecting portion of the split sleeve 20 such that the end of the optical fiber ferrule 19 is brought into tight contact with the physical contact face 8a of the glass rod B.

To suppress reflection of light on the physical contact face 8a, the glass rod 8 is preferably formed of a silica-based glass material having a refractive index close to that of silica, i.e., the material of the optical fiber. However, the glass rod 8 may be formed of a moldable glass material. As the moldable glass material, FCD1, FCD10, or FC5 (tradename) available from HOYA CORP., which has a refractive index close to that of silica, is preferably used.

As shown in FIGS. 3A, 3B, 4A, and 4B, markers 21 necessary for adjusting the position of the semiconductor laser device 2 along the optical axis and in a direction perpendicular to the optical axis are formed on the physical contact face 8a of the glass rod 8 with respect to the end facet of the optical fiber ferrule 19. The markers 21 are formed as linear concave or convex portions or printed outside the light transmission region of the physical contact face 8a of the glass rod 8, i.e., in FIGS. 3A to 4B, at end portions of two straight lines which cross each other.

In case wherein the glass rod 8 is formed of a mold glass material, when three-dimensional patterns for forming the markers 21 are formed in the mold, the markers 21 can be simultaneously formed as three-dimensional patterns in molding the glass rod 8.

In this molding, excess molding glass overflowing from the mold must be let escape. In FIGS. 3A and 3B, an excess mold glass escape portion 22 is arranged outside the light beam transmission region of the glass rod 8 to let excess mold glass escape. In FIGS. 4A and 4B, an excess mold glass escape portion 23 is provided at the split portion of the split sleeve 20 to let excess mold glass escape.

In the example shown in FIGS. 5A and 5B, the most portion of the glass rod 8 is formed of molded glass, only the end portion including the physical contact face 8a is formed from a silica glass plate 8b, and the markers 21 are formed on the silica glass plate 8b. The molded glass portion of the glass rod 6 and the silica glass plate 8b may be bonded with an optical adhesive. In this case, light may be reflected at the junction interface 8c because of the refractive index difference between the two media. However, the light emitted from the laser diode is focused on the physical contact surface 8a, not on the junction interface 8c. The light reflected at the junction interface 8c return in the direction of the laser diode, but it does not focus on the end face of the laser diode, therefore it does not couple into the active region of the laser diode.

As the split sleeve 20, a sleeve consisting of phosphor bronze or zirconia used for a general optical connector may be used. A general sleeve has one split at the side. Alternatively, a sleeve having at least two split portions 24 formed at different positions on two end face sides, as shown in FIGS. 6A to 6C, may be used. The split sleeve 20 having the structure shown in FIGS. 6A to 6C can cope with a case wherein the outer diameter of the glass rod 8 is slightly different from that of the optical fiber ferrule 19.

As shown in FIG. 1, the quarter wave plate 7 is inserted between the optical branching device 4 and the glass rod 8. With this structure, the polarization direction of light emitted from the semiconductor laser device 2 becomes perpendicular to that of reflected/returning light to the semiconductor laser device 2, so that the influence of the reflected/returning light on the transmission characteristics can be reduced. This function will be described later in detail.

The operation of this optical module will be described next.

The operation in the transmission mode will be described first.

When the semiconductor laser device 2 is driven in accordance with an electrical transmission signal, light (transmission optical signal) emitted from the semiconductor laser device 2 is incident on the optical branching device 4 through the first coupling lens 5. Light reflected by the optical branching device 4 passes through the glass rod 8 and is incident on an optical fiber (not shown) mounted in the optical fiber ferrule 19. The light emitted from the semiconductor laser device 2 is focused on the end face of the optical fiber, which is in tight contact with the physical contact face 8a of the glass rod, through the first coupling lens 5.

The light reflected by the end face of the optical fiber can be effectively prevented from returning to the semiconductor laser device 2 by the function of the quarter wave plate 7 and the function of the anti-reflection coatings formed on the optical components 5, 6, and 8.

More specifically, the quarter wave plate 7 has a function of making the polarization direction of the reflected/returning light to the semiconductor laser device 2 perpendicular to that of the light emitted from the semiconductor laser device 2. With this function, the reflected/returning light can be prevented from adversely affecting the transmission characteristics.

This function will be described below in detail with reference to FIGS. 7A and 7B. As shown in FIG. 7A, light emitted from the semiconductor laser device 2 is transmitted through the quarter wave plate 7 with an optical axis (axis C) tilted by 45°, and circularly polarized. The circularly polarized light is incident on the glass rod 8 and coupled to the optical fiber ferrule 19. As shown in FIG. 7B, light reflected/returning from the physical contact face 8a is incident on the λ/4 plate 7 and linearly polarized. The linearly polarized light has a polarization direction perpendicular to that of the light emitted from the semiconductor laser device 2. For this reason, even when the linearly polarized light is recoupled to the semiconductor laser device 2, the transmission characteristics are not influenced.

The operation in the reception mode will be described next.

In the reception mode, a reception optical signal, i.e., light from the optical fiber is incident from the physical contact face 8a of the glass rod 8. The incident light is transmitted through the optical branching device 4 and incident on the photodetector 3 through the second coupling lens 6. The reception light incident on the photodetector 3 is converted into an electrical signal. The incident light from the optical fiber is focused on the light-receiving surface of the photodetector 3 through the second coupling lens 6.

As shown in FIG. 2, the optical axis 6a of the second coupling lens 6 is offset with respect to the optical axis L2 of the incident light from the optical fiber. With this structure, even when the incident light is reflected by the surface of the photodetector 3, the reflected light returns along a path different from that of incident light. Consequently, the reflected light on the end face (physical contact face 8a) of the optical fiber is increased. For this reason, the reflected light can be effectively prevented from being coupled on the optical fiber side.

The assembly of the optical module will be described.

Basically, the accuracies of fixing the optical components may be determined by the device block 1 and the respective optical components i.e., the optical components can be passively aligned. They are fixed using laser welding or a UV curing adhesive.

The coupling lenses 5 and 6 are pressed against the reference surface of the device block 1 and fixed with, e.g., a UV curing adhesive.

One end of the glass rod 8 is covered with the split sleeve 20, and the other end which is not covered with the split sleeve 20 is inserted into the device block 1 and bonded. The opening 1d of the device block 1 in which the other end portion of the glass rod 8 is inserted is formed to be slightly smaller than the diameter of the glass rod 8. The glass rod 8 is fixed while it is pushed against the opening 1d, in order that when an optical connector is connected to the optical module, the spring inside the optical connector pushes its ferrule against the glass rod 8, and the glass rod 8 is forced uniformly against the opening 1d.

The light-receiving diameter of the photodetector 3 is about 10 to 40 times larger than the optical fiber core diameter, and the fixing accuracy of the photodetector 3 may depend on the dimensional accuracy of the device block 1.

On the other hand, positioning of the semiconductor laser device 2 requires a high accuracy, unlike the remaining components. Positioning of the semiconductor laser device 2 will be described below in detail.

The light emission spot size of the semiconductor laser device 2 is smaller than the size of the core of the optical fiber. To couple the light from the laser device 2 into the fiber core efficiently, the size of the mode field of the light emitted from the laser device focused on the end face 8a of the glass rod 8 and the size of the mode field of the optical fiber must have cinder values. For this purpose, this apparatus uses an optical device such as the coupling lens 5 shown in FIG. 1 to extend the focusing spot of the laser beam emitted from the semiconductor laser device 2.

In this structure, if the semiconductor laser device 2 has a positional shift, the spot of emitted light, which is formed on the end face of the glass rod 8, is shifted by an amount corresponding to the positional shift of the semiconductor laser device 2 multiplied by the magnification determined by the optical system including the coupling lens 5. For this reason, as the magnification of the optical system increases, the fixing accuracy of the semiconductor laser device 2 becomes stricter. To increase the allowance for the positional shift of the semiconductor laser device 2, the semiconductor laser device 2 preferably has a large light emission spot size. In addition, the magnification of the optical system 5 is preferably 2× or less.

FIGS. 8 and 9 show the relationships between the positional shifts (along the optical axis and in the direction perpendicular to the optical axis) of the semiconductor laser device 2 and the amount of optical coupling to the optical fiber, which are observed when the diameter of the optical fiber is 10 $\mu$m, and the light emission spot size of the semiconductor laser device 2 is 5 $\mu$m. The focal length of the coupling lens 5 is 3 mm, the focal length of the glass rod 8 is 5.12 mm, the wavelength of light is 1.31 $\mu$m, and the optical path between the coupling lens 5 and the glass rod 8 is 7 mm.

These graphs reveal that, when the coupling loss is to be −4 dB or less, the allowance for the positional shift of the semiconductor laser device 2 is ±42 $\mu$m along the optical axis or ±2.8 $\mu$m in the direction perpendicular to the optical axis.

The positional shift of the semiconductor laser device 2 along the optical axis need not be adjusted when the semiconductor laser device 2, the can package 13 in which the semiconductor laser device 2 is mounted, and the device block 1 obtain their dimensional accuracies at the time of production. More specifically, when the relative positional accuracy between the light-emitting end face of the semiconductor laser device 2 and the can package 13, and the accuracies of the optical component attachment portions of the device block 1 fall within the range of ±32 $\mu$m in total, adjustment along the optical axis can be omitted, and the fixing operation is largely facilitated.

This also applies to the photodetector 3. When the relative positional accuracy between the light-receiving surface of the photodetector 3 and the can package 18 in which the photodetector 3 is mounted and the optical component attachment portions of the device block 1 fall within the range of ±32 $\mu$m in total, adjustment along the optical axis can be omitted.

On the other hand, the allowance for the positional shift in the direction perpendicular to the optical axis is as small as ±2.8 $\mu$m, unlike the positional shift along the optical axis. The positional shift of the semiconductor laser device 2 in the direction perpendicular to the optical axis is adjusted in the following manner.

FIG. 10 is a view showing a method of adjusting the positional shift of the semiconductor laser device 2 in the direction perpendicular to the optical axis. Reference numeral 26 in FIG. 10 denotes an infrared camera for picking up the images of the markers 21 (FIGS. 3A to 4B) formed on the physical contact face 8a of the glass rod 8. An image signal from the infrared camera 26 is input to an image processing unit 27.

On the basis of the relationship between the intensity distribution of the spot of light emitted from the semiconductor laser device 2 on the physical contact face 8a and the images of the markers 21, the image processing unit 27 calculates the positional shift amount of the semiconductor laser device 2 in the direction perpendicular to the optical axis, and supplies the calculated result to a fine adjustment stage driver 28.

The fine adjustment stage driver 28 drives a fine adjustment stage 29 for moving the can package 13 of the semiconductor laser device 2 in the X and Y directions, thereby adjusting the position of the semiconductor laser device 2 in the direction perpendicular to the optical axis.

Processing of the image processing unit 27 will be described below with reference to FIGS. 11 and 12. FIG. 11 shows an image on the physical contact face 8a of the glass rod 8, which is picked up with the infrared camera 26. Reference numerals 21a to 21d denote enlarged images (marker images) of the markers 21; and 30, an image (light spot image) of the spot of light emitted from the semiconductor laser device 2. An intersection 33 of two straight lines 31 and 32 which connect the opposing marker images 21a and 21b and the opposing marker images 21c and 21d, respectively, corresponds to the central point of the physical contact face 8a. This point 33 is a reference point for positioning the semiconductor laser device 2. Positional shifts $\Delta x$ and $\Delta y$ between the point 33 and a central point 34 of the light spot image 30 along the X and Y directions is related to the positional shift of the semiconductor laser device 2. On the basis of these values, the positional shift of the semiconductor laser device is calculated.

Figure 12:
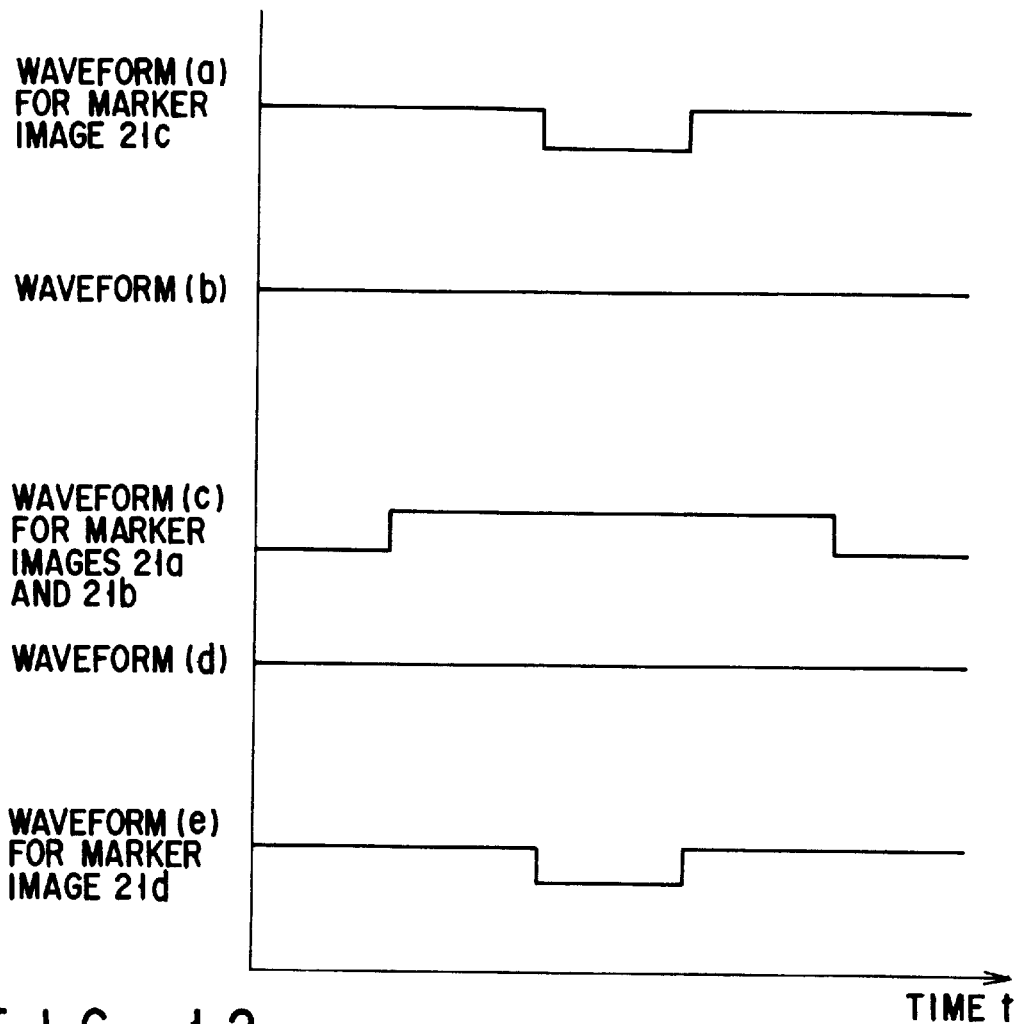
FIG. 12 is a schematic chart showing waveforms of image signals output from the infrared camera.

FIG. 12 is a schematic chart showing waveforms of image signals obtained when the infrared camera 26 performs raster scanning in the X direction in FIG. 11. Referring to FIG. 12, (a) represents a waveform for the marker image 21c on the upper side of the physical contact face 8a; (c), a waveform for the marker images 21a and 21b at the central portion; and (e), a waveform for the marker image 21d on the lower side. In FIG. 12, (b) and (d) correspond to regions between the upper marker image 21c and the central marker images 21a and 21b and between the central marker images 21a and 21b and the lower marker image 21d, respectively, where no marker images are formed. Similar waveforms can be obtained in raster scanning in the Y direction.

The image processing unit 27 can recognize the point 33 in FIG. 11 on the basis of the timing information of the waveforms. The image processing unit 27 can also easily recognize the central point 34 of the light spot image 30. Therefore, the positional shift of the semiconductor laser device 2 in the direction perpendicular to the optical axis can be calculated from the central points 33 and 34.

In FIG. 12, the image signals corresponding to the marker images are at a level lower than that of the peripheral region. However, the image signals may be at a higher level.

Alternatively, the centers of gravity of the marker images 21a to 21d in FIG. 11 may be obtained by the image processing unit 27. The two straight lines 31 and 32 which connect the marker images 21a and 21b and the marker images 21c and 21d, respectively, and the intersection 33 of these lines may be obtained on the basis of these centers of gravity to obtain the positional shifts $\Delta x$ and $\Delta y$ from the intersection 33 in the X and Y directions.

The fine adjustment stage driver 28 drives the fine adjustment stage 29 on the basis of the information of the positional shift calculated from $\Delta x$ and $\Delta y$ by two-dimensional image processing of the image processing unit 27 such that both $\Delta x$ and $\Delta y$ become zero, thereby adjusting the position of the semiconductor laser device 2 in the direction perpendicular to the optical axis.

After this adjustment, the package 13 is fixed to the device block 1 by YAG welding, thereby completing positioning of the semiconductor laser device 2. With this positioning, the positional shift amount of $\pm 2$ $\mu$m or less in the direction perpendicular to the optical axis can be achieved. Accordingly, the positional shifts can be suppressed within the allowance ($\pm 2.8$ $\mu$m) described in FIG. 9.

Figure 13:
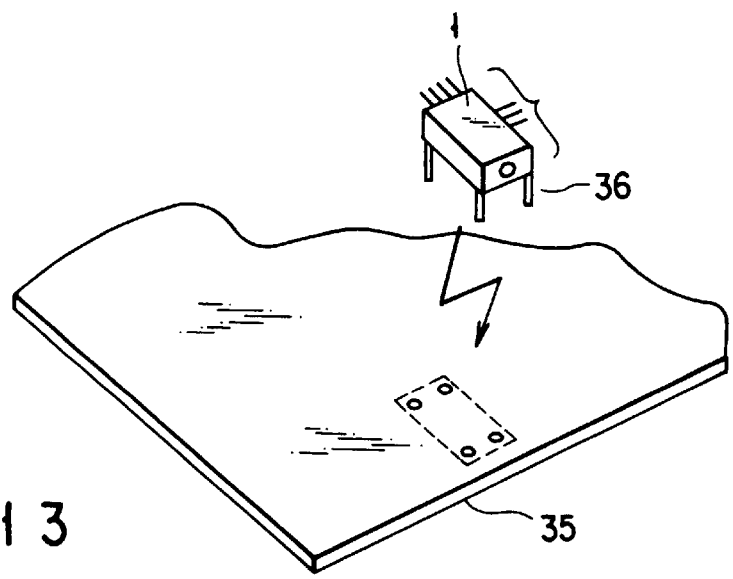
FIG. 13 is a perspective view showing a method of mounting the optical module.

The optical module which has been assembled in the above way is mounted on a board substrate 35, as shown in FIG. 13. In this case, leads 36 may be projected from the bottom portion of the device block 1 of the optical module and soldered to the board substrate 35.

According to the above optical module and the method of manufacturing the optical module, the following effects can be obtained.

First, positioning and fixing of the semiconductor laser device 2 can be automatically performed on the $\mu$m order. Therefore, the working time required for positioning/fixing the semiconductor laser device 2 can be largely shortened to result in cost reduction of the optical transmission/reception apparatus.

More specifically, in this embodiment, the markers 21 are formed on the physical contact face 8a of the glass rod 8 with respect to the optical fiber ferrule 19. On the basis of the marker images and the spot image of light emitted from the semiconductor laser device 2, the positional shift of the semiconductor laser device 2 can be calculated. The semiconductor laser device is positioned in the direction perpendicular to the optical axis on the basis of the positional shift information. With this method, positioning and fixing on the order of $\mu$m can be automatically performed.

Second, reflected/returning light from the photodetector 3 can be effectively prevented from being coupled to the optical fiber.

More specifically, in this embodiment, the axis 6a of the second coupling lens 6 is shifted from the optical axis L2 of incident light by a predetermined amount, as shown in FIG. 2. That is, the axis 6a is offset with respect to the optical axis L2. With this structure, the incident angle of reflected light on the physical contact face 8a of the glass rod 8 is increased. For this reason, the reflected/returning light can be effectively prevented from being coupled to the optical fiber.

Third, light reflected by the end face of the optical fiber can be effectively prevented from being focused on the semiconductor laser device 2 through the proposed optical system. Therefore, an adverse effect on the transmission characteristics can be effectively prevented.

More specifically, when the glass rod 8 is formed by glass molding, Fresnel reflection takes place because of the refractive index mismatch even when physical contact between the glass rod 8 and the optical fiber end face is achieved. This light returns and is coupled to the semiconductor laser device 2, resulting in unstable transmission characteristics.

In this embodiment, to solve this problem, the $\lambda/4$ plate 7 is inserted in the optical path between the coupling lens 5 and the glass rod 8 in the optical module such that the polarization direction of reflected/returning light to the semiconductor laser device 2 becomes orthogonal to that of light emitted from the semiconductor laser device 2. With this structure, the influence of the reflected/returning light on the transmission characteristics can be minimized.

The second embodiment of the present invention will be described next with reference to FIGS. 14 and 15.

In this embodiment, a semiconductor laser device 2 can be positioned without forming markers 21 on the glass rod 8, unlike the first embodiment.

The arrangement of the second embodiment is the same as that of the first embodiment except that no markers 21 need be formed on the glass rod 8, and a detailed description thereof will be omitted. Only the positioning method will be described below.

In this embodiment, a pinhole plate 38 having a small pinhole 38a is arranged in front of a physical contact face 8a of the glass rod 8, and the image of the pinhole 38a is picked up with an infrared camera 26. The pinhole plate 38 may be formed of transparent material such as glass. By using a transparent plate as the pinhole plate 38, even when the image of the light emitted from the semiconductor laser device is focused outside the pinhole, it can be recognized by the infrared camera 26. Alternatively, a ferrule consisting of glass may be cut and used.

An image signal from the infrared camera 26 is input to an image processing unit 27. On the basis of the relationship between the image of the pinhole 38a of the pinhole plate 38 and the intensity distribution of the spot of light emitted from the semiconductor laser device 2, the image processing unit 27 calculates the positional shift of the semiconductor laser device 2 in the direction perpendicular to the optical axis and supplies the calculated result to a fine adjustment stage driver 28. The driver 28 drives a fine adjustment stage 29 for moving a can package 13 of the semiconductor laser device 2 in the X and Y directions, thereby adjusting the position of the semiconductor laser device 2 in the direction perpendicular to the optical axis.

Processing of the image processing unit 27, which is performed to position the semiconductor laser device 2 using the pinhole plate 38 will be described below in more detail with reference to FIG. 15.

FIG. 15 shows an image on the pinhole plate 38, which is picked up with the infrared camera 26. Reference numeral 38a denotes the pinhole image; and 40, an image (light spot image) of the spot of light emitted from the semiconductor laser device 2.

Assume that the pinhole plate 38 is set such that a center 41 of the pinhole image 38a serves as a reference point for positioning the semiconductor laser device 2. In this case, shift components $\Delta x$ and $\Delta y$ between the center 41 and a center 42 of the light spot image 40 in the X and Y directions are related to the positional shift of the semiconductor laser device 2 in the direction perpendicular to the optical axis, and from these values the positional shift of the semiconductor laser device can be calculated.

To position the semiconductor laser device 2 in the direction perpendicular to the optical axis, the infrared camera 26 is focused on the pinhole 38a first. Next, the semiconductor laser device 2 is drived to emit light, and the intensity distribution of the light spot image 40 is recognized. When the positional shift of the semiconductor laser device 2 is large, the light spot image 40 is partially covered by the pinhole plate 38, as shown in FIG. 15. Even in this state, the shift ($\Delta x$, $\Delta y$) can be recognized.

The positional shift ($\Delta x$, $\Delta y$) is obtained by the image processing unit 27 in this way. As in the first embodiment, the fine adjustment stage 29 is driven by the fine adjustment stage driver 28 such that both $\Delta x$ and $\Delta y$ become zero, thereby adjusting the position of the semiconductor laser device 2 in the direction perpendicular to the optical axis. Subsequently, after the pinhole plate 38 is extracted, the package base 13 is fixed by YAG welding, thereby completing attachment of the semiconductor laser device 2.

According to this method using the pinhole plate 38, the observation range of the infrared camera 26 can be narrower than that of the case using the markers 21. Therefore, the time required for focusing of the infrared camera 26 and positioning can be shortened.

The above-described method of positioning the semiconductor laser device 2 can be applied to a case wherein the semiconductor laser device 2 is arranged on the same axis as that of the glass rod 8, i.e., at the position of the photodetector 3.

The present invention is not limited to the above embodiments.

For example, the method of manufacturing the glass rod 8 is not limited to the method of the first embodiment. Alternatively, a cylindrical silica glass preform may be used. The silica glass preform may be drawn under appropriate temperature and speed conditions such that the preform has the same diameter as the outer diameter of the optical fiber ferrule 19, and cut to an appropriate length. An end face serving as the physical contact face 8a may be formed into a spherical shape.

In both the methods of manufacturing the glass rod 8, the physical contact face 8a may be simultaneously formed in manufacturing the glass rod 8, or formed later using a spherical surface polisher for the ferrule.

Particularly, when the glass rod 8 is formed of silica glass, the refractive index difference is substantially absent. No Fresnel reflection occurs in physical contact to the optical fiber ferrule 19, thus improving the optical coupling efficiency. In addition, since the silica glass is excellent in chemical stability and as hard as the optical fiber ferrule 19, a long-time stability can be obtained even when the optical fiber connector is repeatedly attached/detached.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A receptacle-type optical transmission/reception apparatus comprising:

a casing;

a glass rod rigidly affixed to said casing and including a physical contact face contacted with an optical fiber ferrule;

a receptacle arranged in said casing and configured to detachably hold said optical fiber ferrule in tight contact with said physical contact face of said glass rod;

a semiconductor laser device arranged in said casing and configured to emit light through said glass rod;

a photodetecting device arranged in said casing and configured to detect light incident through said glass rod; and an optical branching device configured to guide the light emitted from said semiconductor laser device to said glass rod and to guide the light incident through said glass rod to said photodetecting device.

2. An apparatus according to claim 1, wherein the casing comprises:

an accommodation portion including a reception unit configured to receive a face of the glass rod opposite said physical contact face.

3. A receptacle-type optical transmission/reception apparatus comprising:

a casing;

a glass rod arranged in said casing and including a physical contact face contacted with an optical fiber ferrule;

a receptacle arranged in said casing and configured to detachably hold said optical fiber ferrule in tight contact with said physical contact face of said glass rod;

a semiconductor laser device arranged in said casing and configured to emit light through said glass rod;

a photodetecting device arranged in said casing and configured to detect light incident through said glass rod;

an optical branching device configured to guide the light emitted from said semiconductor laser device to said glass rod and to guide the light incident through said glass rod to said photodetecting device; and an incident light imaging optical system arranged in said casing and configured to form an image of the incident light on a photodetector, said imaging optical system having an optical axis shifted substantially in parallel from that of the incident light.

4. An apparatus according to claim 3, wherein at least said physical contact face of said glass rod is formed of substantially the same material as that of a core of an optical fiber.

5. An apparatus according to claim 3, further comprising:

a marker formed on said physical contact face of said glass rod configured to position said semiconductor laser device.

6. A receptacle-type optical transmission/reception apparatus comprising:

a casing;

a glass rod arranged in said casing and having a physical contact face to be contacted tightly with an optical fiber ferrule;

a receptacle arranged in said casing to detachably hold said optical fiber ferrule in tight contact with said physical contact face of said glass rod;

a semiconductor laser device arranged in said casing to emit light through said glass rod;

a quarter wave plate arranged in said casing on an optical path of the light emitted from said semiconductor laser device.

7. A receptacle-type optical transmission/reception apparatus comprising:

a casing;

a glass rod arranged in said casing and having a physical contact face to be contacted tightly with an optical fiber ferrule;

a semiconductor laser device arranged in said casing to emit light through said glass rod; and a marker formed on said physical contact face of said glass rod to position said semiconductor laser device.

8. A method of manufacturing a receptacle-type optical module having a casing, a glass rod arranged in said casing and including a physical contact face configured to contact tightly with an optical fiber ferrule, and a semiconductor laser device arranged in said casing and configured to emit light through said glass rod, comprising the steps of:

causing said semiconductor laser device to emit light;

picking up a spot image of the light from said semiconductor laser device on said physical contact face;

detecting a positional shift of said semiconductor laser device from the desired position on the basis of a shift amount of said spot image from a central position of said physical contact face; and positioning said semiconductor laser device on the basis of information of the positional shift.

9. A method according to claim 8, further comprising:

detecting the central position of said physical contact face on the basis of a marker formed on said physical contact face.

10. A method according to claim 8, further comprising:

detecting the central position of said physical contact face with reference to a pinhole of a pinhole plate inserted in said casing in order to be coaxial with said glass rod.

* * * * *